US006735091B2

(12) United States Patent
Megason et al.

(10) Patent No.: US 6,735,091 B2
(45) Date of Patent: May 11, 2004

(54) CARDGUIDE RETAINER

(75) Inventors: George D. Megason, Spring, TX (US); Daniel T. Thompson, Houston, TX (US); Joseph R. Allen, Tomball, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/128,104

(22) Filed: Apr. 23, 2002

(65) Prior Publication Data

US 2002/0109977 A1 Aug. 15, 2002

Related U.S. Application Data

(63) Continuation of application No. 09/591,524, filed on Jun. 9, 2000, now Pat. No. 6,381,149.

(51) Int. Cl.[7] .............................. H05K 7/14; H05K 7/18
(52) U.S. Cl. ........................ 361/801; 361/759; 361/802
(58) Field of Search .................................. 361/756–759, 361/801–802; 312/215–216, 223.1, 223.2, 265.5, 265.6; 211/41.17; 439/151–153

(56) References Cited

U.S. PATENT DOCUMENTS

| 5,673,175 | A | * | 9/1997 | Carney et al. ............... 292/202 |
| 5,914,854 | A | | 6/1999 | Holt ........................... 361/683 |
| 5,982,627 | A | * | 11/1999 | Haughton et al. .......... 206/706 |
| 6,181,565 | B1 | | 1/2001 | Schmitt et al. ............. 361/756 |
| 6,291,766 | B1 | * | 9/2001 | Komai ...................... 174/35 R |

\* cited by examiner

Primary Examiner—Kamand Cuneo
Assistant Examiner—Tuan Dinh

(57) ABSTRACT

A printed circuit board retainer to direct the movement of a printed circuit board during installation into an enclosure. In a relaxed position, the retainer forms a barrier to the withdrawal of the printed circuit board from the enclosure. The printed circuit board retainer may be displaced from its relaxed position and locked in an open position to facilitate installation and withdrawal of the printed circuit board.

18 Claims, 4 Drawing Sheets

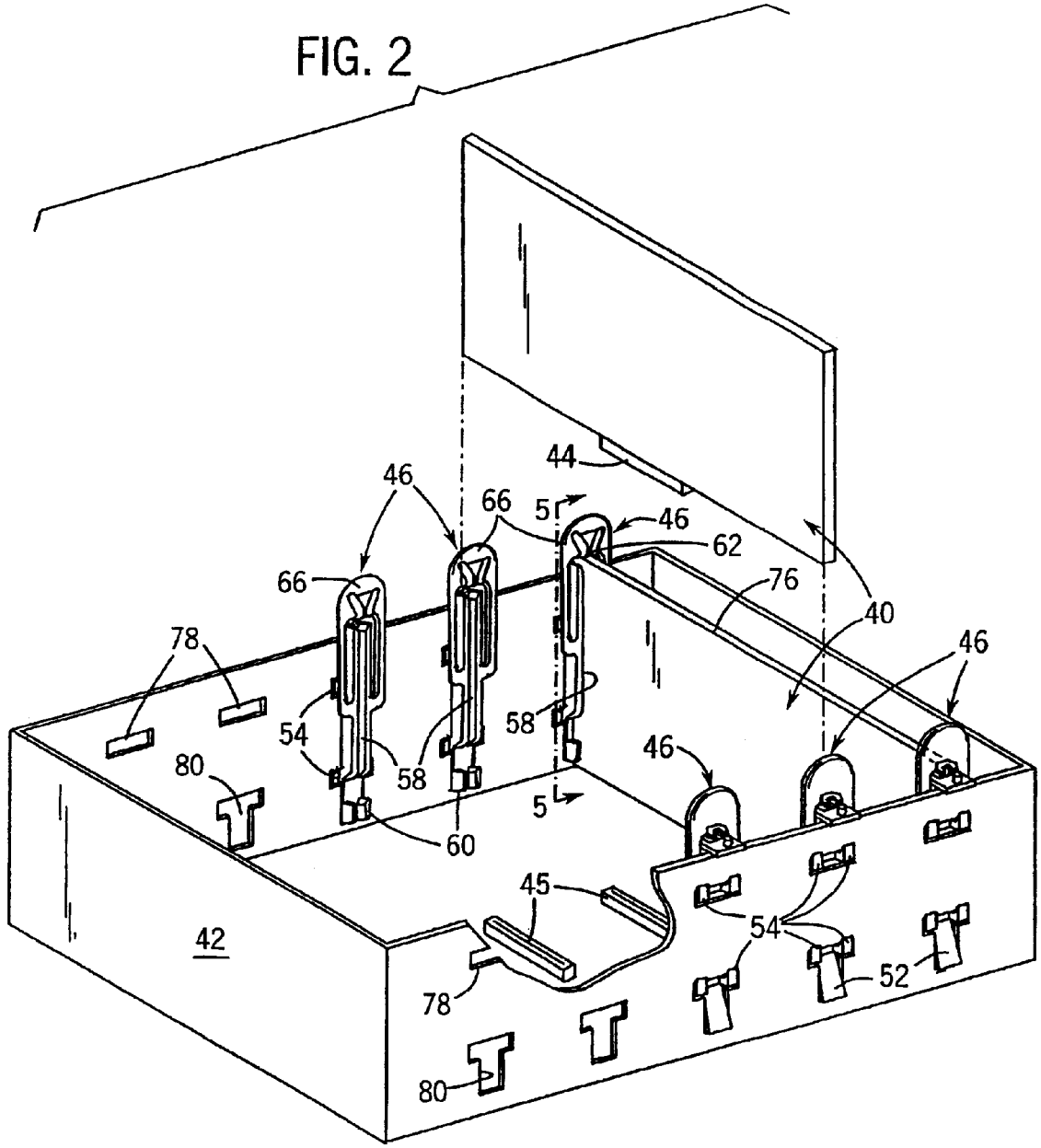

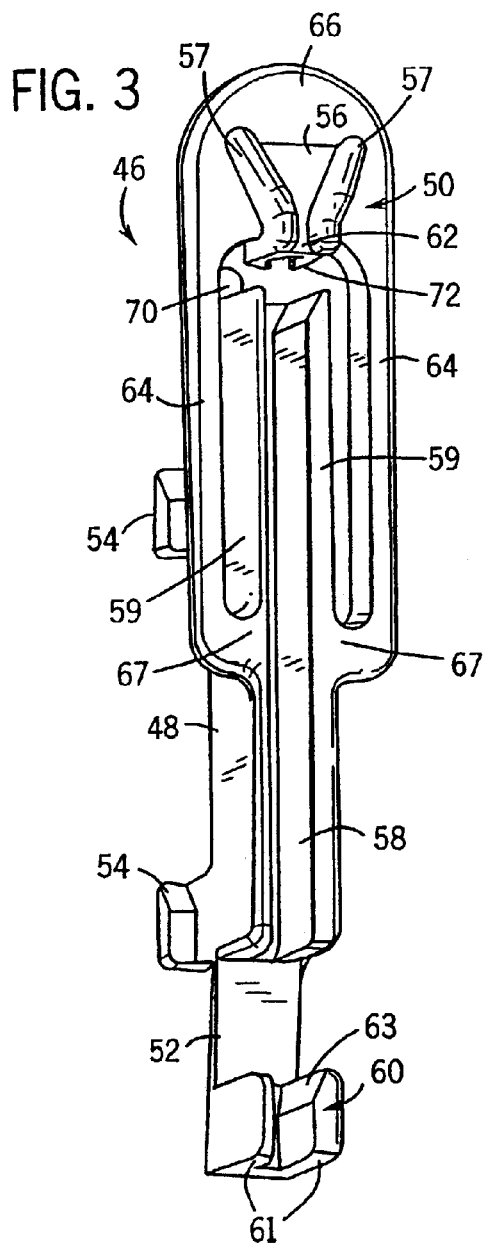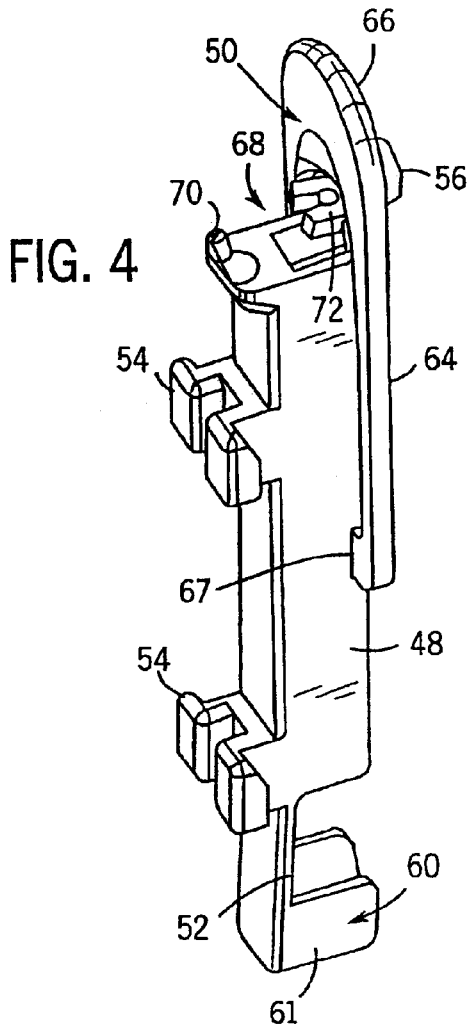

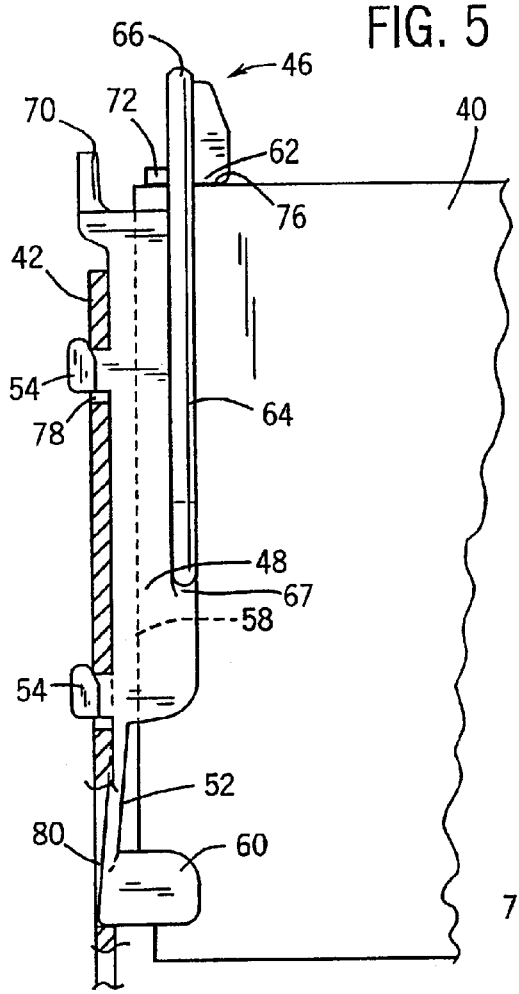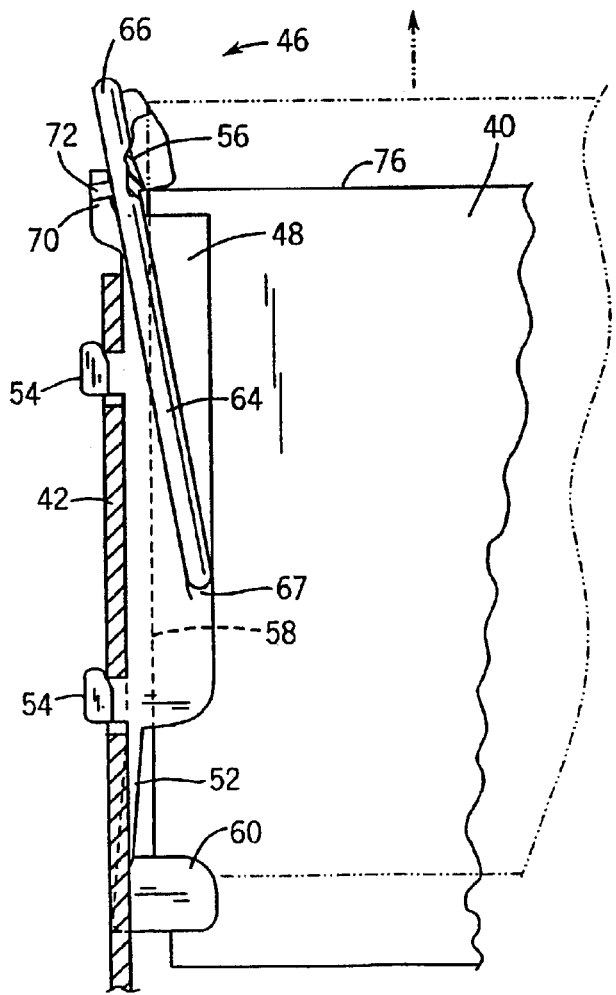

CARDGUIDE RETAINER

This application is a Continuation of application Ser. No. 09/591,524 filed on Jun. 9, 2000 now U.S Pat. No. 6,381,149.

FIELD OF THE INVENTION

The present invention relates generally to a system and method for installing printed circuit boards into an electronic device, and particularly to a device for guiding and retaining a printed circuit board in an electronic device.

BACKGROUND OF THE INVENTION

Printed circuit boards, otherwise known as boards or cards, serve as a basic framework for assembling electrical components into a useful electronic device. In a typical electronic device, electronic components are mounted onto a surface of the board. Metal lead wires from the component are then soldered to conductive traces on the board. Soldering the leads to the board serves two purposes: first, it secures the electronic component to the printed circuit board and, second, it ensures a good electrical connection between the electronic component and the conductive path.

In many electronic devices, such as computers, the electronic components are mounted onto several printed circuit boards. In order for the electronic components to perform their desired function, each of the boards must be electrically coupled to the electrical system of the device. Typically, a printed circuit board contains an electrical connector configured to mate with a corresponding electrical connector within the electrical device. When mated, the electrical connectors create conductive paths between the board and the device.

Typically, electrical connectors are configured in a male-female configuration, i.e., a male connector is physically inserted into a female connector. Generally, the board is configured with a male connector and a receiving assembly within the electrical device is configured with a female connector. For example, boards frequently are constructed with edge connectors consisting of conductive traces terminating at the edge of the board. A corresponding female connector within the device contains conductive spring contacts that engage the conductive board traces when the board edge is inserted into the female connector. Frequently, cardguides are used to guide a card into proper mating position so that the electrical connector on the card aligns with the corresponding electrical connector in the electrical device.

Once inserted, the board typically is secured within the device. Several different mechanisms have been used to secure a board within an electrical device. For example, screws are commonly used to secure a board to an electrical device. Typically, the board has at least two holes through which screws are inserted. The screws are then threaded into a threaded socket within the device, securing the board to the device. However, this method can be complicated, requiring the alignment and rotated insertion of small screws, which can be easily dropped or lost.

Clamps and latches are another example of a mechanism used to secure a board within an electrical device. The latches are extendable over one or more corners of a card. When extended over the corner of a card, the latches prevent inadvertent withdrawal of the card from the device. However, the latch must be operated to secure the board when installing the card into the cardguide and/or positioned out of the way by an operator when removing or installing a board from the electrical device. Thus, two hands are required to remove and install a card, one hand to hold the latch out of the way of the card and a second hand to apply the force to physically remove or install the card.

Therefore, it would be advantageous to have an apparatus that could properly align a card during the installation of the card and retain the card within the device without requiring an operator to continuously manipulate the apparatus during either installation or removal of the card.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

According to one aspect of the present invention, a circuit board retainer is featured. The circuit board retainer includes a guide portion and a retainer portion. The guide portion has a channel to direct movement of a circuit board to an installed location. The retainer portion is flexibly mounted to the guide portion. The retainer portion includes an abutment that may be selectively moved between an obstructing position in line with the channel and an unobstructing position.

According to another aspect of the present invention, an electrical device is featured. The electrical device includes a printed circuit board, an enclosure, and a printed circuit board retainer. The printed circuit board retainer included a guide that directs movement of the printed circuit board to and away from an installed location. The printed circuit board retainer also includes a retention portion flexibly connected to the guide. The retention portion is operable to selectively restrict movement of the printed circuit board from the guide.

According to another aspect of the present invention, a method of securing a printed circuit board in an enclosure is featured. The method includes providing a guide slot for slidably receiving a printed circuit board and selectively preventing release of the printed circuit board from the guide slot by a spring biased abutment.

BRIEF DESCRIPTION OF THE DRAWINGS

The invention will hereafter be described with reference to the accompanying drawings, wherein like reference numerals denote like elements, and:

FIG. 2 is a perspective view of an electrical device utilizing electronic components mounted on a printed circuit board, according to a preferred embodiment of the present invention;

FIG. 3 is a front perspective view of a printed circuit board guide and retainer, according to a preferred embodiment of the present invention;

FIG. 4 is a rear perspective view of a printed circuit board guide and retainer, according to a preferred embodiment of the present invention;

FIG. 5 is a side view of a printed circuit board inserted into a printed circuit board guide and retainer, according to a preferred embodiment of the present invention; and FIG. 6 is a side view of a printed circuit board inserted into a printed circuit board guide and retainer with a locking mechanism engaged, according to a preferred embodiment of the present invention.

DETAILED DESCRIPTION OF THE PREFERRED EMBODIMENTS

Figure 1:
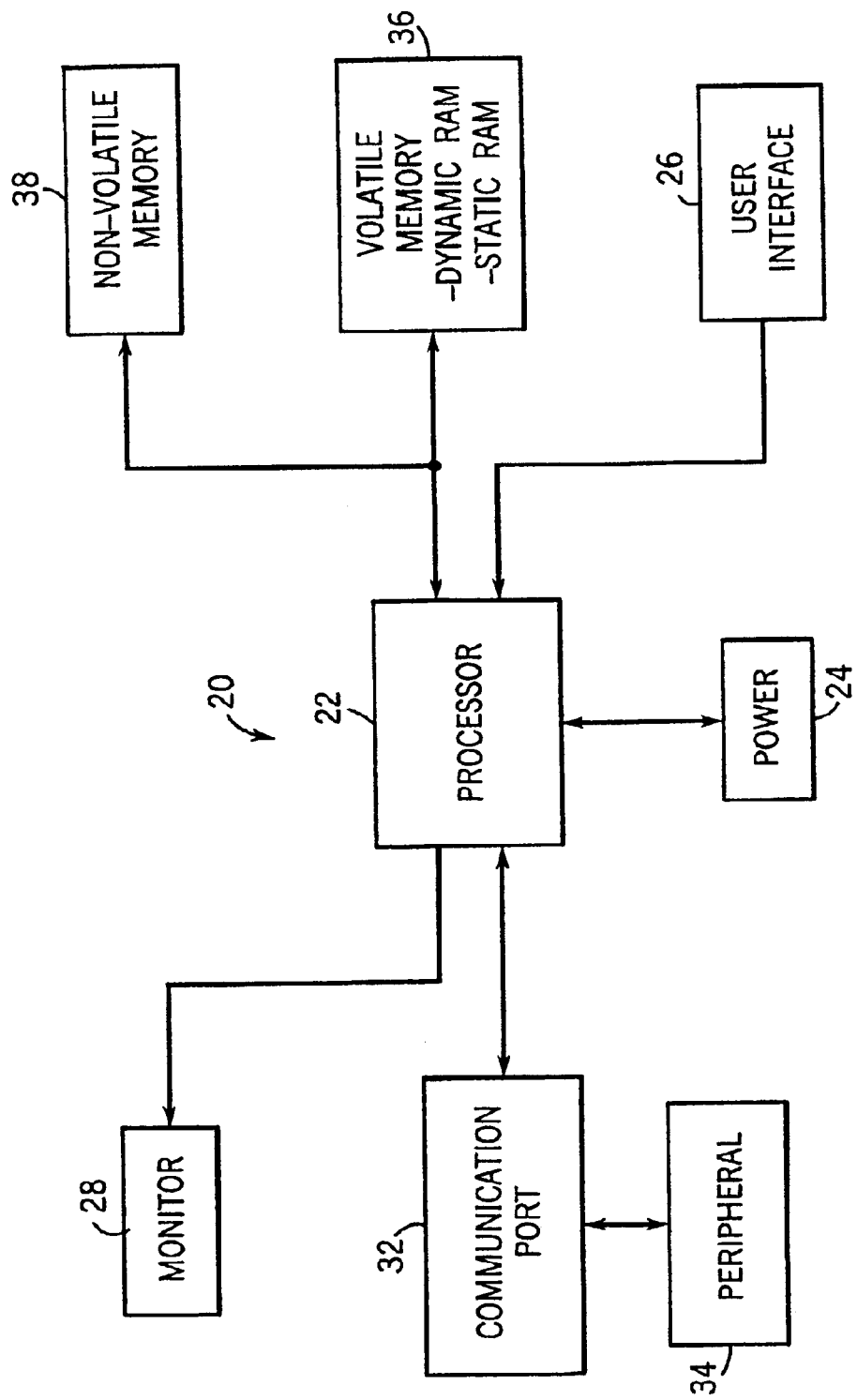
FIG. 1 is a block diagram of an electronic device.

Referring generally to FIG. 1, a block diagram is illustrated depicting an exemplary electronic device, generally designated by the reference numeral 20. The electronic device 20 may be any of a variety of different types, such as a control circuit, a personal computer, a workstation, an Internet server, a minicomputer, etc.

Electronic device 20 may be composed of a number of different electronic components, such as resistors, capacitors, transistors, etc. Today, many electronic devices also include a processor 22 to control the function of the device 20. The processor 22 may be a microprocessor, such as used in a personal computer. Electronic devices also typically require a power supply 24. Various additional devices may be coupled to the processor 22, as necessary, depending on the desired functions of the device 20. For instance, a user interface 26 may be coupled to the processor 22 to allow an operator to control some or all of the functions of the device. Examples of user interfaces include a keyboard, a mouse, or a joystick. A monitor 28 may be coupled to the processor 22 to allow an operator to view visual information provided by the device. This information may be displayed on the monitor as part of a graphical user interface. A communications port 32 may also be used to couple processor 22 to peripheral devices 34, such as a modem, a printer, or a computer.

Software programming is typically used to control the operation of a processor and this software programming is typically stored in electronic memory. There are several different types of electronic memory available for use in electronic devices. For example, the processor 22 may be coupled to volatile memory 36. Volatile memory may include dynamic random access memory (DRAM) and/or static random access memory (SRAM). The processor 22 also can be coupled to non-volatile memory 38. Non-volatile memory 38 may include a read only memory (ROM), such as an EPROM, to be used in conjunction with the volatile memory. The non-volatile memory 38 may include a high capacity memory such as a disk or tape drive memory.

Referring generally to FIG. 2, many of the interior electronic components used in electronic device 20 are mounted on a printed circuit board 40. The printed circuit board 40 is installed within a protective enclosure 42. In the illustrated embodiment, the electrical device includes multiple printed circuit boards 40 housed within enclosure 42. Furthermore, in this embodiment, the printed circuit boards are manufactured to a standard length, width and thickness. However, the present invention can be used with a single printed circuit board or a plurality of printed circuit boards in a variety of different shapes, sizes, configurations and orientations. Boards 40 include an electrical connector 44 that mates with and electrically couples a printed circuit board 40 to another electrical connector 45 within enclosure 42.

A printed circuit board guide 46 provides each printed circuit board with guidance for alignment. Circuit board guide 46 directs the electrical connector 44 of the printed circuit board 40 towards a respective electrical connector 45 within enclosure 42. Guide 46 ensures that the electrical connectors mate when printed circuit board 40 is fully inserted and then secures board 40 in place.

In the illustrated embodiment, a pair of circuit board guides 46 are shown for each respective printed circuit board, one on each side. However, a printed circuit board 40 can be guided and retained using only one printed circuit board guide 46. For example, a single circuit board guide, designed according to the present invention, can be used on one side of a board and a conventional board guide on the opposing boardside. Alternatively, some applications may not require another card guide on the opposing side.

In the illustrated embodiment, the board guides 46 are manufactured from a flexible material, such as plastic. Each board guide 46 is shaped such that in a normal, unflexed position a portion of the board guide obstructs the movement of an installed printed circuit board 40. However, the flexible material permits the obstructing portion to be flexed away from board 40 to permit withdrawal of the board. As described more fully later, the obstructing portion of board-guide 46 can be locked in an unobstructing position.

Referring generally to FIG. 3, a front perspective view is shown of a board guide 46, according to a preferred embodiment of the present invention. Guide 46 preferably is a single piece produced from molded plastic. Various portions of the guide are shaped to perform different functions, including a primary guide 48, a retainer portion 50, an angled tailpiece 52, and several mounting feet 54.

Guide 46 is designed to initially receive a printed circuit board through a tapered guide 56 in the retainer portion 50. Tapered guide 56 is defined by a pair of side walls 57 that gradually taper inward from a wider channel to a narrower channel. Tapering the channel facilitates insertion of board 40 into board guide 46. Tapered guide 56 is located to direct a board into a channel 58 formed in primary guide 48 and defined by channel walls 59. Similarly, channel 58 is generally aligned with a board guide channel 60 formed at the end of angled tailpiece 52 and defined by a pair of tabs 61. Each tab 61 includes a chamfered lead edge 63. Channels 58 and 60 are wide enough to accept the edge of the printed circuit board, yet narrow enough to restrict lateral movement of the board upon insertion. Retainer portion 50 prevents linear movement of the board along channels 58 and 60 as discussed below.

In addition to guiding the printed circuit board, board guide 46 secures printed circuit board 40 in the subject electronic device, e.g., server or personal computer, via retainer 50. Retainer 50 includes an abutment surface 62 that normally forms a barrier, or obstruction, to the edge of an installed printed circuit board. Board guide 46 is formed, e.g., by molding, such that retainer 50 is connected to the primary guide 48 by a flexible member 64, preferably a pair of flexible members 64.

An outer portion of retainer 50 includes a contact surface 66 for the application of a bending force. In the illustrated embodiment, contact surface 66 is configured such that an operator can use a thumb or finger to apply a bending force to position the retainer 50. Inserting board 40 into tapered guide 56 will also produce a bending force. When bending force is applied to flexible members 64, abutment surface 62 is bent out of the way of the edge of the printed circuit board, removing retainer 50 as an impediment to the printed circuit board.

As best illustrated in FIG. 3, the flexible members 64 extend along the sides of primary guide 48 before joining primary guide 48 at a joint 67. Extending the flexible members 64 in this manner produces a larger torque arm, thus allowing the retainer 50 and flexible member 64 to be bent by a smaller bending force. During installation of a printed circuit board, flexible members 64 are bent, or displaced, from their normal position. When printed circuit board 40 has passed through retainer 50 and into the primary guide 48, flexible members 64 can be returned to their original position, thereby securing the printed circuit board in place.

Referring generally to FIG. 4, a rear perspective view is shown of a printed circuit board guide and retainer 46, according to a preferred embodiment of the present invention. In the illustrated embodiment, a locking mechanism 68 is included to maintain the retainer 50 in a flexed position such that the abutment surface 62 does not create a barrier to insertion or withdrawal of the printed circuit board 40 from the board guide and retainer 46. Thus anyone attempting to remove a board does not have to maintain a continuous force on the contact surface 66 during removal of a printed circuit board 40. Additionally, if desired, the locking mechanism 68 can be used to facilitate installation of the printed circuit board 40.

In the illustrated embodiment, the exemplary locking mechanism 68 is comprised of a pin-and-yoke assembly. A pin 70 is formed on primary guide 48 while a yoke 72 is formed on the retainer 50. When a force is applied to the contact surface 66 the yoke 72 is bent towards the pin 70. If the retainer 50 is flexed sufficiently, yoke 72 is forced around and grips pin 70, maintaining the retainer 50 in a flexed position.

Referring generally to FIG. 5, the operation of board guide 46 can be fully explained. In this side view a printed circuit board 40 is fully inserted into a printed circuit board guide 46. The abutment surface 62 of retainer 50 extends over a top edge 76 of board 40, and forms a barrier to prevent the withdrawal of the printed circuit board from guide 46. However, it is important to note that the retainer 50 of the present invention is not limited to engaging a top edge or corner of a printed circuit board. Retainer 50 also can be designed to engage a notch, or other element, of a printed circuit board.

As further illustrated, mounting feet 54 and angled tailpiece 52 secure guide 46 to enclosure 42. Mounting feet 54 are sized and spaced to fit into respective slots 78 in the side of the enclosure 44. Similarly, angled tailpiece 52 is biased into a slot 80. Slots 78 and 80 are configured so that when the mounting feet 54 are initially inserted into their respective slots 78 the angled tailpiece 52 is compressed against the inside surface of enclosure 42. When board guide 46 is lifted, the mounting feet 54 abut the top of their respective slots 78 and are prevented from further upward movement. The upward movement also is sufficient to permit angled tailpiece 52 to flex into its designated slot 80. Once tailpiece 52 flexes into slot 80, any further downward movement of the card guide 46 is prevented.

It should be noted that the board guide can be used in a variety of applications not all of them involving enclosures, e.g., an electronics rack. Also, board guide 46 may be designed without mounting feet 54 or an angled tailpiece 52 and secured by glue, screws or other mechanisms.

In FIG. 6, locking mechanism 70 is illustrated as engaged to facilitate removal of card 40. Retainer 50 is in a flexed position, and abutment surface 62 of retainer 50 is no longer in position to obstruct withdrawal of printed circuit board 40. Board 40 can be removed simply by gripping and lifting it from board guide 46.

It will be understood that the foregoing description is of preferred exemplary embodiments of this invention, and that the invention is not limited to the specific forms shown. For example, the board guide of the present invention need not be composed entirely of molded plastic material. Also, a variety of mechanisms other than the pin-and-yoke can be used to hold the retention member in a flexed position so that it does not obstruct the path of a printed circuit board during insertion and/or removal. These and other modifications may be made in the design and arrangement of the elements without departing from the scope of the invention as expressed in the appended claims.

What is claimed is:

1. A circuit board retainer, comprising:
   a guide portion having a channel to direct movement of a circuit board to an installed location;
   a retainer portion flexibly mounted to the guide portion, the retainer portion comprising an abutment that is selectively positionable between an obstructing position in line with the channel and an unobstructing position, wherein the retainer portion includes a flexible member such that if the abutment is displaced from the obstructing position the flexible member produces a biasing force to drive the retainer back towards the obstructing position; and
   a locking mechanism, wherein the locking mechanism comprises a first member disposed on the guide portion and a second member disposed on the retainer portion operable to hold the retainer portion in the unobstructing position.

2. The circuit board retainer as recited in claim 1, wherein the retainer portion is operable to position the abutment so that movement of a circuit board out of the device is unobstructed.

3. The circuit board retainer as recited in claim 1, wherein the retainer portion includes a tapered guide to direct the movement of the circuit board card.

4. The circuit board retainer as recited in claim 1, wherein the guide portion and the retainer portion are comprised of a single piece of molded plastic.

5. The circuit board retainer as recited in claim 3, further comprising an angled tailpiece.

6. The circuit board retainer as recited in claim 5, wherein the angled tailpiece includes a guide to hold and direct movement of the circuit board.

7. A circuit board retainer, comprising:
   a guide portion having a channel to direct movement of a circuit board to an installed location;
   a retainer portion flexibly mounted to the guide portion, the retainer portion including an abutment that is selectively movable between an obstructing position in line with the channel and an unobstructing position; and
   a locking mechanism, wherein the locking mechanism is operable to hold the retainer portion in the unobstructing position, the locking mechanism comprising a first member disposed on the guide portion and a second member disposed on the retainer portion.

8. The circuit board retainer as recited in claim 7, wherein the locking mechanism comprises a pin and a yoke.

9. An electrical device, comprising:
   a printed circuit board;
   an enclosure; and
   a printed circuit board retainer including:
      a guide that directs movement of the printed circuit board to and away from an installed location;
      a retention portion flexibly connected to the guide and operable to selectively restrict movement of the printed circuit board from the guide, the retention portion including an abutment flexibly connected to the guide by a flexible member, wherein the flexible member is biased to return the abutment to a position whereby movement of the printed circuit board from the guide is restricted; and a locking mechanism, wherein the locking mechanism comprises a first member disposed on the guide and a second member disposed on the retention portion operable to hold the retention portion in an unobstructing positions.

10. The electrical device as recited in claim 9, wherein the flexible member is sufficiently flexible to position the abutment so that the abutment does not restrict movement of the printed circuit board into or out of the guide.

11. The electrical device as recited in claim 10, wherein the printed circuit board retainer is secured to the enclosure.

12. The electrical device as recited in claim 10, wherein the printed circuit board includes a microprocessor disposed thereon.

13. The electrical device as recited in claim 10, wherein the printed circuit board a memory chip disposed thereon.

14. The electrical device as recited in claim 10, wherein the printed circuit board retainer comprises a molded plastic material.

15. The electrical device as recited in claim 11, wherein the enclosure includes a slot and the guide includes an angled tailpiece having a spring element that fits into, the slot.

16. An electrical device, comprising:

a printed circuit board;

an enclosure; and a printed circuit board retainer including:
 a guide that directs movement of the printed circuit board to and away from an installed location;
 a retention portion flexibly connected to the guide and operable to selectively restrict movement of the printed circuit board from the guide, the retention portion comprising an abutment flexibly connected to the guide by a spring member; and
 a locking mechanism comprising a first member disposed on the guide and a second member disposed on the retention portion to hold the flexible member at an open position wherein the guide is unobstructed by the abutment.

17. The electrical device as recited in claim 16, wherein the locking mechanism comprises a pin-and-yoke assembly.

18. An enclosure assembly for an electronic device, comprising:

an enclosure; and a circuit board retainer, comprising:
 a first portion affixed to the enclosure, the first portion having a channel to receive a circuit board; and
 a second portion flexibly secured to the first portion, the second portion being adapted to be flexed from a relaxed position to a flexed position, wherein the second portion prevents a circuit board from being withdrawn from the enclosure when in the relaxed position and enables the circuit board to be withdrawn from the enclosure when in the flexed position;
 wherein the first portion has a first securing member and the second portion has a second securing member, the first and second securing members being adapted to cooperate to lock the second portion in the flexed position.

* * * * *